United States Patent
Ha et al.

(10) Patent No.: US 10,957,225 B2
(45) Date of Patent: Mar. 23, 2021

(54) FOLDABLE DISPLAY DEVICE

(71) Applicant: Samsung Display Co., Ltd., Yongin-si (KR)

(72) Inventors: Seung Hwa Ha, Hwaseong-si (KR); Seung-Ho Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/699,083

(22) Filed: Nov. 28, 2019

(65) Prior Publication Data
US 2020/0234616 A1 Jul. 23, 2020

(30) Foreign Application Priority Data
Jan. 22, 2019 (KR) .................. 10-2019-0008157

(51) Int. Cl.
*G09F 9/30* (2006.01)
*G06F 1/16* (2006.01)
*H01L 51/00* (2006.01)

(52) U.S. Cl.
CPC ............ *G09F 9/301* (2013.01); *G06F 1/1652* (2013.01); *H01L 51/0097* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 9,204,565 B1 | 12/2015 | Lee et al. | |
| 9,874,906 B1 | 1/2018 | Hsu | |
| 10,083,636 B2 | 9/2018 | Han | |
| 2013/0329162 A1 | 12/2013 | Fujii et al. | |
| 2014/0217397 A1* | 8/2014 | Kwak | H01L 27/1218 257/43 |
| 2016/0018855 A1 | 1/2016 | Liao et al. | |
| 2018/0130966 A1* | 5/2018 | Yun | H01L 27/3244 |
| 2018/0150111 A1 | 5/2018 | Kim et al. | |

FOREIGN PATENT DOCUMENTS

| | | |
|---|---|---|
| EP | 2674930 | 12/2013 |
| JP | 2004-110303 | 4/2004 |
| KR | 10-2017-0061313 | 6/2017 |
| KR | 10-2018-0061879 | 6/2017 |
| KR | 10-2018-0021299 | 3/2018 |

OTHER PUBLICATIONS

Extended European Search Report dated Jun. 5, 2020 issued in EP Patent Application No. 20151707.5.

* cited by examiner

*Primary Examiner* — Robin J Mishler
(74) *Attorney, Agent, or Firm* — H.C. Park & Associates, PLC

(57) ABSTRACT

A foldable display device including: a display panel; a cover window disposed on the display panel; and a base film attached below the display panel, wherein the base film includes a first metal sheet and a second metal sheet bonded to the first metal sheet, and the first metal sheet includes a first flat portion, a second flat portion, and an inclined portion bent from the first flat portion and the second flat portion.

18 Claims, 15 Drawing Sheets

FOLDABLE DISPLAY DEVICE

CROSS-REFERENCE TO RELATED APPLICATION

This application claims priority from and the benefit of Korean Patent Application No. 10-2019-0008157, filed on Jan. 22, 2019, which is hereby incorporated by reference for all purposes as if fully set forth herein.

BACKGROUND

Field

Exemplary embodiments of the invention relate to a foldable display device.

Discussion of the Background

Display devices, such as an organic light emitting device and a liquid crystal display device, include display panels manufactured by forming a plurality of layers and elements on a substrate. Glass is used for the substrate of the display panel. However, the glass substrate is heavy and easily broken. Further, the glass substrate is rigid so it is difficult to transform the display panel. Recently, flexible display panels using flexible substrates that are light, resistant to external impacts, and are easily transformed, and flexible display devices including the same, have been developed.

The flexible display devices may be classified into a bendable display device, a foldable display device, a rollable display device, and a stretchable display device according to usage or types. Among them, the foldable display device may be folded or unfolded, similar to a book.

The foldable display device may be folded to be compactly portable, and it may be unfolded to display a wide screen in the case of using it. When the foldable display device is repeatedly folded and unfolded, a bent area of the display panel (a bending area hereinafter) may be deformed and the bending area may be damaged. Further, the bending area and other areas may be deformed, such as being buckled or fractured to thus be damaged.

The above information disclosed in this Background section is only for understanding of the background of the inventive concepts, and, therefore, it may contain information that does not constitute prior art.

SUMMARY

Exemplary embodiments of the invention provide a foldable display device for reducing deformation and damage.

Additional features of the inventive concepts will be set forth in the description which follows, and in part will be apparent from the description, or may be learned by practice of the inventive concepts.

An exemplary embodiment of the invention provides a foldable display device including: a display panel; a cover window disposed on the display panel; and a base film attached below the display panel. The base film includes a first metal sheet and a second metal sheet bonded to the first metal sheet, and the first metal sheet includes a first flat portion, a second flat portion, and an inclined portion bent from the first flat portion and the second flat portion.

When the foldable display device is folded, bent portions at respective sides of the inclined portion may be unbent and the first metal sheet may be deformed.

The first metal sheet may include a first portion and a second portion that are separated from each other.

The first portion may include a first flat portion, a second flat portion, and an inclined portion bent from the first flat portion and the second flat portion. The second portion may include a first flat portion, a second flat portion, and an inclined portion bent from the first flat portion and the second flat portion.

The second flat portion of the first portion may face the flat portion of the second portion, and the second metal sheet may overlap the second flat portion of the first portion and the second flat portion of the second portion.

An upper surface of the first flat portion of the first portion, an upper surface of the first flat portion of the second portion, and an upper surface of the second metal sheet may be provided on a same level.

A lower surface of the first flat portion of the first portion, a lower surface of the first flat portion of the second portion, and a lower surface of the second metal sheet may be provided on a same level.

The base film further may include a step compensating layer disposed on the first metal sheet and the second metal sheet.

The base film may further include a step compensating layer disposed on the first metal sheet and not on the second metal sheet.

A gap between the inclined portion and the second metal sheet may be filled with a filler.

The first metal sheet may further include a third flat portion, and an inclined portion bent from the second flat portion and the third flat portion.

When a curvature radius of the base film that is bent when the foldable display device is folded is set to be r millimeters, a distance between the first flat portion and third flat portion may be within ($\pi$r+10) millimeters.

A plurality of holes may be defined in the inclined portion, and the second metal sheet may include a plurality of protrusions inserted into the holes.

Another exemplary embodiment of the invention provides a foldable display device including: a display panel; a cover window disposed on the display panel; and a base film attached below the display panel. The base film may include a first metal sheet and a second metal sheet overlapping the first metal sheet, and the first metal sheet may include a first portion and a second portion that are separated, while the second metal sheet may be bonded to the first portion and the second portion.

The first portion may include a first flat portion, a second flat portion, and an inclined portion bent from the first flat portion and the second flat portion. The second portion may include a first flat portion, a second flat portion, and an inclined portion bent from the first flat portion and the second flat portion.

A second flat portion of the first portion may face a flat portion of the second portion, and the second metal sheet may be bonded to a second flat portion of the first portion and a second flat portion of the second portion.

The inclined portion of the first portion may be bent from the first flat portion of the first portion at an acute angle, and the inclined portion of the second portion may be bent from the first flat portion of the second portion at an acute angle.

When the foldable display device is folded, bent portions at respective sides of the inclined portion may be unbent and a length of the first metal sheet may increase.

The base film may further include a step compensating layer disposed on the first metal sheet and the second metal sheet, and the base film may be attached to the display panel by an adhesive layer.

The base film may further include a step compensating layer disposed on the first metal sheet and not on the second metal sheet, and the base film may be attached to the display panel by an adhesive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
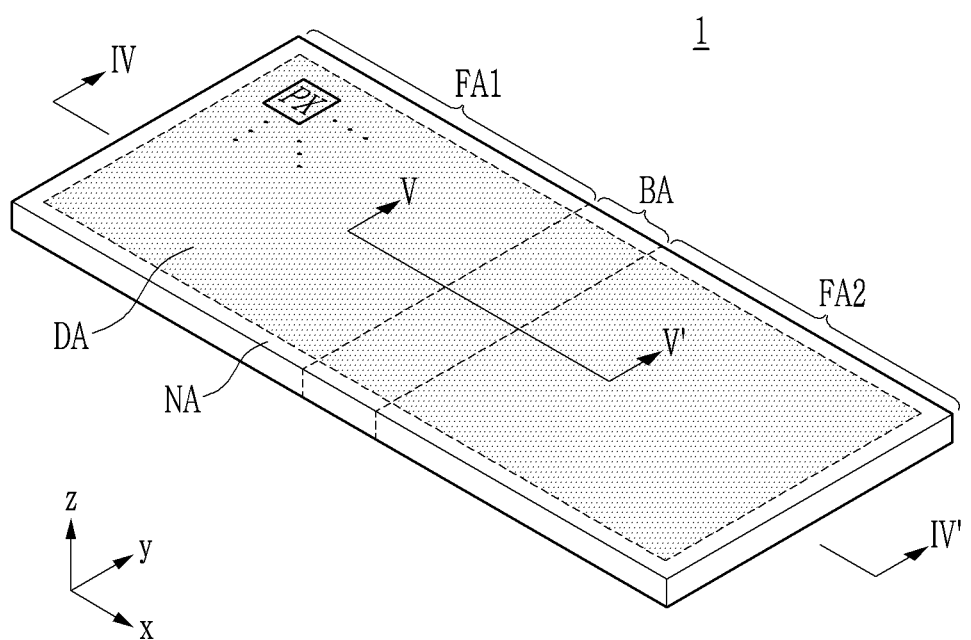
FIG. 1 shows a perspective view of an unfolded state of a foldable display device according to an exemplary embodiment.

In the following description, for the purposes of explanation, numerous specific details are set forth in order to provide a thorough understanding of various exemplary embodiments of the invention. As used herein, "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The phrase "in a plan view" means viewing the object portion from the top, and the phrase "in a cross-sectional view" means viewing a cross-section of which the object portion is vertically cut from the side.

A foldable display device according to an exemplary embodiment will now be described with reference to accompanying drawings.

In the drawings, a symbol x used to express a direction represents a first direction, a symbol y indicates a second direction that is perpendicular to the first direction, and a symbol z denotes a third direction that is perpendicular to the first direction and the second direction. The first direction x, the second direction y, and the third direction z may respectively correspond to a horizontal direction, a vertical direction, and a thickness direction of the foldable display device.

A foldable display device will now be described with reference to FIG. 1 to FIG. 3.

Figure 2:
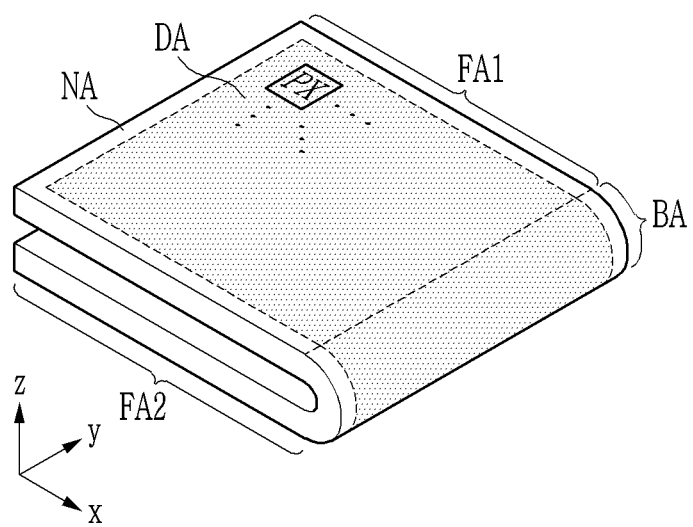
FIG. 2 shows a perspective view of a first folding state of a foldable display device shown in FIG. 1.
Figure 3:
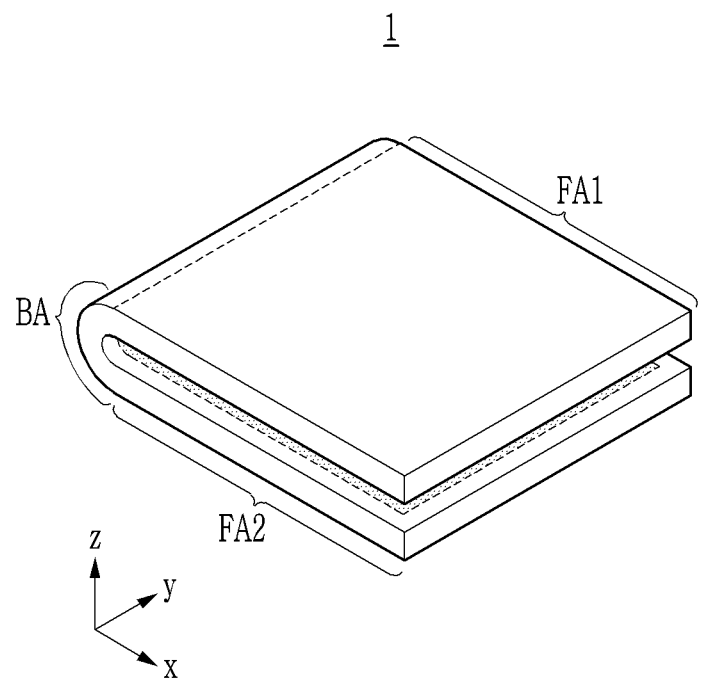
FIG. 3 shows a perspective view of a second folding state of a foldable display device shown in FIG. 1.

FIG. 1 shows a perspective view of an unfolded state of a foldable display device 1 according to an exemplary embodiment, FIG. 2 shows a perspective view of a first folding state of a foldable display device 1 shown in FIG. 1, and FIG. 3 shows a perspective view of a second folding state of a foldable display device 1 shown in FIG. 1.

The foldable display device 1 (also referred to as a display device hereinafter) may be unfolded to be flat as shown in FIG. 1, and may be folded as shown in FIG. 2 and FIG. 3. The display device 1 may include a bending area BA, and a first flat area FA1 and a second flat area FA2 provided on respective sides of the bending area BA. The bending area BA is a region that is bent when the display device 1 is folded, and the first flat area FA1 and the second flat area FA2 are substantially not bent.

One bending area BA is shown, and the display device 1 may include a plurality of bending areas BA that are separated from each other or are bent with different curvature radii. For example, the display device 1 may include at least two bending areas and at least three flat areas.

The display device 1 may include a display area DA for displaying an image and a non-display area NA for surrounding the display area DA. The display area DA may correspond to a screen on which pixels PX are arranged, and the non-display area NA may correspond to a bezel.

The display device 1 may, as shown in FIG. 2, be folded to expose the screen to the outside (hereinafter, out-folding or first folding). Differing from this, the display device 1 may, as shown in FIG. 3, be folded so that the screens face each other, that is, the screen of the first flat area FA1 may face the screen of the second flat area FA2 (hereinafter, in-folding or second folding). In the out-folding state, the screen of the bending area BA may be exposed so that a user may watch it, and in the in-folding state, the screen of the bending area BA may be covered. The display device 1 may be designed to allow one of the out-folding and the in-folding. When the display device 1 includes a plurality of bending areas BA, one of them may be a bending area that allows out-folding and the other may be a bending area that allows in-folding.

The display device 1 may further include a housing, and various components for configuring the display device 1, for example, a display panel, a driving device, a processor, a memory, a printed circuit board (PCB), a battery, a communication module, a speaker, or various sensors may be received in the housing.

Figure 4:
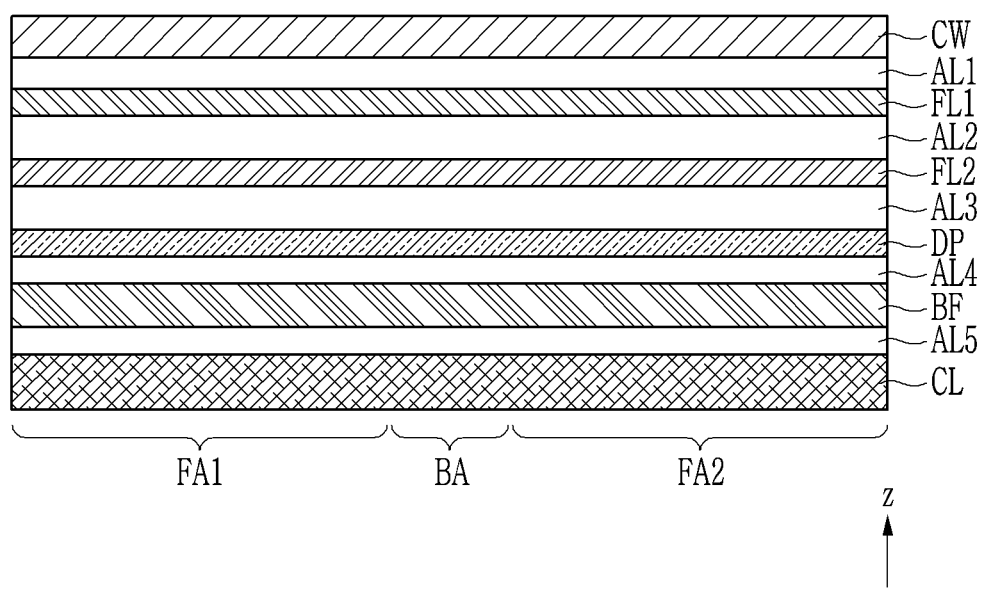
FIG. 4 shows a cross-sectional view according to an exemplary embodiment taken along a line IV-IV' in FIG. 1.

FIG. 4 shows a cross-sectional view according to an exemplary embodiment taken along a line IV-IV' in FIG. 1.

Referring to FIG. 4, the display device 1 has a configuration in which various structures are stacked. The display device 1 includes a display panel DP, and a cover window CW for protecting the display panel DP. At least one of function layers FL1 and FL2 may be provided between the display panel DP and the cover window CW. A base film BF may be provided below the display panel DP. A cushion layer CL may be provided below the base film BF. The display panel DP, the cover window CW, the function layers FL1 and FL2, the base film BF, and the cushion layer CL may be attached by adhesive layers AL1 through AL5.

The display panel DP is a panel in which pixels for displaying an image are formed on the substrate. The display panel DP may include light emitting diodes (LEDs) corresponding to pixels. The display panel DP is a flexible panel, at least part of which may be bent. For example, a region of the display panel DP corresponding to at least the bending area BA of the display device 1 may be flexible and bent, and it may be generally flexible.

The cover window CW is an optically transparent layer, and a surface thereof is exposed outside the display device 1. The cover window CW may protect components provided below it, particularly the display panel DP.

The cover window CW is a flexible window, at least part of which is bendable. For example, a region of the cover window CW corresponding to the bending area BA of at least the display device 1 may be flexible and bent, and it may be totally flexible. The cover window CW may be a polymer film made of a polymer, such as a polyimide (PI) or a polyethylene terephthalate (PET), to achieve a flexible characteristic. The cover window CW may be a glass film that is formed to be thin (e.g., a thickness that is less than 100 micrometers) or that is generated by locally thinly forming the region corresponding to the bending area BA of the display device 1. The flexible cover window CW may be weaker than a rigid cover window (e.g., a glass plate that is about 100 micrometers thick) when protecting the display panel DP from external impacts.

The first function layer FL1 and the second function layer FL2 may be provided between the display panel DP and the cover window CW. In the present specification, the function layers signify layers for performing specific functions in addition to the adhering function. For example, one of the first function layer FL1 and the second function layer FL2 may be a touch panel, and the other thereof may be an antireflection layer.

Regarding the touch panel, a touch sensor layer may be exemplarily formed on a polymer film, such as a polyimide. The touch sensor layer may sense a contact and/or non-contact touch of the user. The touch sensor layer may include touch electrodes formed of a transparent conductive material, such as an indium tin oxide (ITO) or an indium zinc oxide (IZO), or a metal mesh, and the touch electrodes may be formed to be a single layer or a multilayer. The touch sensor layer may not be provided in a touch panel form, and it may be formed on the surface of the display panel DP.

The antireflection layer is a layer for reducing reflection of external light, it may include a polarization layer and/or a phase delay layer, and the polarization layer and/or the phase delay layer may have a film form. The antireflection layer may be formed on the display panel DP, and for example, it may be coated thereon.

The base film BF provided below the display panel DP may have a relatively high modulus (or modulus of elasticity), and for example, it may have a modulus of about 10 to about 100 GPa, or it may have the modulus that is equal to or greater than 100 GPa. The base film BF reduces transformation of the bending area BA, and allows the bending area BA to be bent with a constant curvature. The base film BF may reduce buckling of the components provided below the display panel DP, and deformation caused by the buckling or decoupling of layers. The base film BF may be a metal sheet made of a metal or a metal alloy such as Invar or stainless steel (or SUS). The metal sheet may have a micrometer-based thickness, and for example, it may be about 15 to about 50 micrometers thick. The base film BF may be made of a polymer such as a polyimide (PI) or a polyethylene terephthalate (PET). When the base film BF is a polymer film, it may have a modulus of about 1 to about 10 GPa.

The cushion layer CL provided below the base film BF may protect the components provided above the same, particularly the display panel DP. The cushion layer CL may absorb impacts to protect the display panel DP, and it may attach the display panel DP to other components, such as a frame, a bracket, or a housing without damage. The cushion layer CL may exemplarily be a porous layer, such as a foam resin. Functional sheets, such as a light blocking sheet, a heating sheet, or a waterproof tape, may be further provided below the base film BF, in addition to the cushion layer CL.

In the illustrated exemplary embodiment, adhesive layers AL1 through AL5 are provided between the cover window CW and the first function layer FL1, between the first function layer FL1 and the second function layer FL2, between the second function layer FL2 and the display panel DP, between the display panel DP and the base film BF, and between the base film BF and the cushion layer CL. The adhesive layers AL1 through AL5 may include a pressure sensitive adhesive (PSA) or an optically clear adhesive (OCA).

When the base film BF is a metal sheet, the base film BF has a substantially higher modulus than the display panel DP of the display device 1, the function layers FL1 and FL2, and/or the cover window CW, so it may apply a stress to the display panel DP, the function layers FL1 and FL2, and/or the cover window CW to cause a fracture. Further, the metal has a short deformation section because of its characteristics, so when the stress increases to above a yield stress, it reaches an ultimate stress and is fractured, thereby generating very much less deformation. There are flexible metals that are easily transformed, but it is difficult to adapt them as a base film BF of the foldable display device 1.

When the foldable display device 1 in which a plurality of components are stacked is repeatedly folded and unfolded, fatigue stresses of the display panel DP, the function layers FL1 and FL2, and/or the cover window CW may be accumulated and it may be deformed (e.g., extended). However, the base film BF of the metal sheet is rarely deformed when the foldable display device 1 is repeatedly folded and unfolded, so the display panel DP, the function layers FL1 and FL2, and/or the cover window CW may be buckled, and separation of layers or fractures may be generated by the buckling.

A base film BF that is made of a metal sheet and may be transformed corresponding to deformation of other layers in the foldable display device 1 will now be described with reference to FIG. 5 through FIG. 14. FIG. 1 through FIG. 4 will also be referenced so as to describe a relationship with other components of the foldable display device 1 even if there is no specific mention.

Figure 5:
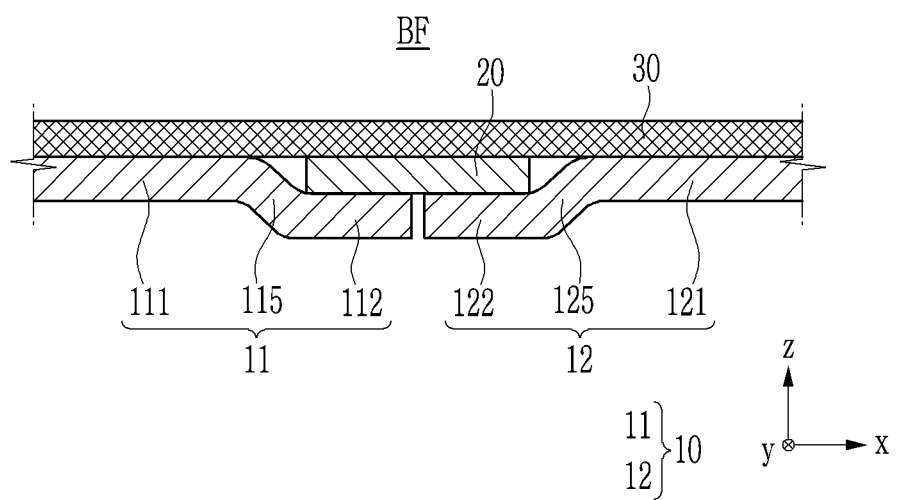
FIG. 5 shows a cross-sectional view of a base film according to an exemplary embodiment taken along a line V-V in FIG. 1.
Figure 6:
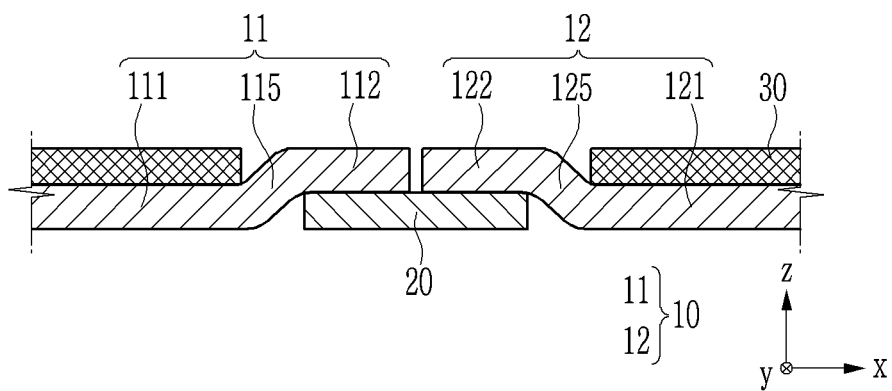
FIG. 6 shows a cross-sectional view of a base film according to an exemplary embodiment taken along a line V-V in FIG. 1.
Figure 7:
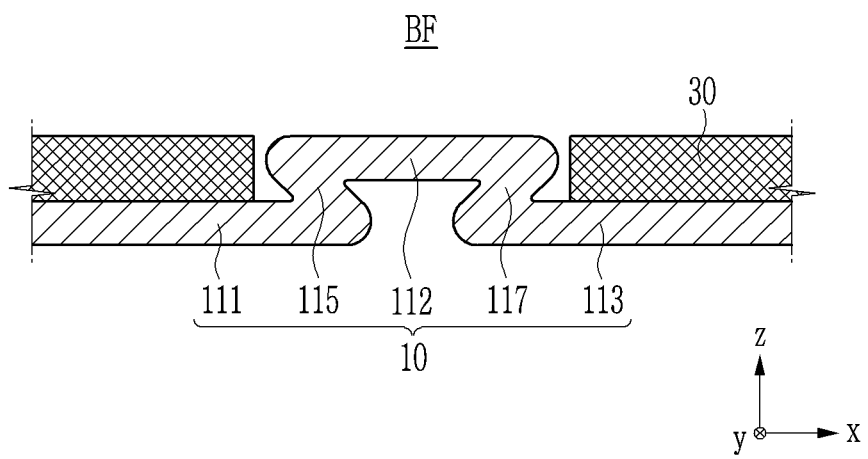
FIG. 7 shows a cross-sectional view of a base film according to an exemplary embodiment taken along a line V-V in FIG. 1.

Each of FIG. 5, FIG. 6, and FIG. 7 shows a cross-sectional view of a base film according to an exemplary embodiment taken along a line V-V of FIG. 1.

Referring to FIG. 5, the base film BF includes a first metal sheet 10, a second metal sheet 20, and a step compensating layer 30.

The first metal sheet 10 includes a first portion 11 and a second portion 12 that are separated from each other. The first portion 11 may be provided in a first flat area FA1 of the display device 1, and the second portion 12 may be provided in a second flat area FA2 of the display device 1. The first portion 11 and the second portion 12 are bent in a second direction y. As a result, the first portion 11 includes a first flat portion 111, a second flat portion 112, and an inclined portion 115 provided therebetween. The second portion 12 includes a first flat portion 121, a second flat portion 122, and an inclined portion 125 provided therebetween.

The inclined portions 115 and 125 are bent from the first flat portions 111 and 121 at an acute angle, and are bent from the second flat portions 112 and 122 at an acute angle. The second flat portions 112 and 122 are provided below the first flat portions 111 and 121 by the inclined portions 115 and 125, that is, they are further distant from the display panel DP than the first flat portions 111 and 121. There is a step between the first flat portions 111 and 121 and the second flat portions 112 and 122 by the inclined portions 115 and 125, so the inclined portions 115 and 125 may be referred to as "step portions".

The first flat portion 111 of the first portion 11 may be equivalent to or substantially on the same level as the first flat portion 121 of the second portion 12, and the second flat portion 112 of the first portion 11 may be equivalent to or substantially on the same level as the second flat portion 122 of the second portion 12. The second flat portion 112 of the first portion 11 and the second flat portion 122 of the second portion 12 face each other and are separated from each other with a predetermined interval therebetween.

Regarding the display device 1, the first flat portion 111 may be provided in the first flat area FA1, the first flat portion 121 may be provided in the second flat area FA2, and the second flat portions 112 and 122 may be provided in the bending area BA. The inclined portion 115 may be provided in the first flat area FA, may be provided in the bending area BA, or may be provided in the first flat area FA1 and the bending area BA, and the inclined portion 125 may be provided in the second flat area FA2, may be provided in the bending area BA, or may be provided in the second flat area FA2 and the bending area BA.

When the bending area BA is small, for example, when the base film BF is designed to be bent with a curvature radius of about 1.0 millimeters in the case that the display device 1 is folded, a width of the bending area BA is several millimeters. Therefore, when the first metal sheet 10 is integrally formed, it may be difficult to form the inclined portions 115 and 125 by a press process using a mold. However, when the first metal sheet 10 is divided into two portions 11 and 12, the inclined portions 115 and 125 are formed by applying a press process to the portions 11 and 12, so it becomes easy to form the inclined portions 115 and 125.

The second metal sheet 20 is provided along the bending area BA in the second direction y on the second flat portions 112 and 122, and it overlaps the second flat portions 112 and 122. The second metal sheet 20 and the first metal sheet 10 are bonded to each other by welding, brazing, or press-in, or the like. The second metal sheet 20 may be bonded to the second flat portions 112 and 122 on the first metal sheet 10. An upper surface of the second metal sheet 20 may be equivalent to or substantially identical to the level of upper surfaces of the first flat portions 111 and 121 of the first metal sheet 10. That is, the upper surface of the second metal sheet 20 and the upper surfaces of the first flat portions 111 and 121 of the first metal sheet 10 may be coplanar. The first metal sheet 10 and the second metal sheet 20 bonded to each other are metal sheets substantially configuring the base film BF. The first metal sheet 10 and the second metal sheet 20 may respectively have a thickness of about 15 to 50 micrometers.

A step compensating layer 30 is provided on the first metal sheet 10 and the second metal sheet 20. The step compensating layer 30 flattens the upper surface of the base film BF by compensating the step that may be generated between the first metal sheet 10 and the second metal sheet 20. The step compensating layer 30 may be formed of a cushion or a resin with high elasticity. The step compensating layer 30 may exemplarily be attached in a cushion tape form to the surfaces of the first metal sheet 10 and the second metal sheet 20. Referring to FIG. 4 as well, the display panel DP may be provided on the step compensating layer 30, and may be attached to the step compensating layer 30 of the base film BF by the adhesive layer AL4. The step compensating layer 30 may be omitted. In this case, the display panel DP may be attached to the first metal sheet 10 and the second metal sheet 20 of the base film BF by the adhesive layer AL4.

When the first metal sheet 10 is bonded to the second metal sheet 20 and the first metal sheet 10 includes the inclined portions 115 and 125 as described above, and when the bending area BA is bent by the folding of the display device 1, bent portions on respective sides of the inclined portions 115 and 125 are unbent and a length of the first metal sheet 10 may increase. The bent portions on the respective sides of the inclined portions 115 and 125 function as a spring. Accordingly, when the display panel DP, the function layers FL1 and FL2, and/or the cover window CW are transformed, the base film BF may be deformed according to the transformation, so the display panel DP, the function layers FL1 and FL2, and/or the cover window CW may be prevented from being buckled or fractured.

Referring to FIG. 6, in a manner to an exemplary embodiment described with reference to FIG. 5, the base film BF includes a first metal sheet 10, a second metal sheet 20, and a step compensating layer 30. However, the first metal sheet 10 and the second metal sheet 20 are formed as if the first metal sheet 10 and the second metal sheet 20 are turned over, as shown in FIG. 5. An exemplary embodiment shown with reference to FIG. 6 will focus on the difference from the exemplary embodiment shown with reference to FIG. 5.

The first metal sheet 10 includes a first portion 11 and a second portion 12 that are separated from each other. The first portion 11 includes a first flat portion 111, a second flat portion 112, and an inclined portion 115 provided therebetween, and the second portion 12 includes a first flat portion 121, a second flat portion 122, and an inclined portion 125 provided therebetween. The inclined portions 115 and 125 are bent from the first flat portions 111 and 121 at an acute angle, and are bent from the second flat portions 112 and 122 at an acute angle. The second flat portions 112 and 122 are provided above the first flat portions 111 and 121 by the inclined portions 115 and 125, that is, they are provided near the display panel DP, and the upper surfaces of the second flat portions 112 and 122 are provided above the upper surfaces of the first flat portions 111 and 121.

The second metal sheet 20 is provided along the bending area BA in the second direction y below the second flat portions 112 and 122, and is bonded to the first metal sheet 10. The lower surface of the second metal sheet 20 may be equivalent to or in substantially the same level as the lower surfaces of the first flat portions 111 and 121 of the first metal sheet 10, that is, it may be substantially coplanar. The first metal sheet 10 and the second metal sheet 20 bonded to each other are metal sheets substantially configuring the base film BF.

The step compensating layer 30 is provided on the first metal sheet 10. In further detail, the step compensating layer 30 may be provided on the first flat portions 111 and 121 of the first metal sheet 10, and it may not be provided on the second metal sheet 20. The step compensating layer 30 may exemplarily be attached in a cushion tape form to the upper surfaces of the first flat portions 111 and 121. The upper surface of the step compensating layer 30 and the upper surfaces of the second flat portions 112 and 122 of the first metal sheet 10 may be substantially coplanar. Therefore, the step compensating layer 30 may flatten the upper surface of the base film BF by compensating a step that may be generated between the first flat portions 111 and 121 and the second flat portions 112 and 122 of the first metal sheet 10. Referring to FIG. 4, the display panel DP may be provided on the step compensating layer 30, and it may be attached to the step compensating layer 30 of the base film BF and the second flat portions 112 and 122 of the first metal sheet 10 by the adhesive layer AL4. The step compensating layer 30 may be omitted. In this case, the display panel DP may be attached to the first metal sheet 10 of the base film BF by the adhesive layer AL4.

When the first metal sheet 10 and the second metal sheet 20 are bonded and the first metal sheet 10 includes inclined portions 115 and 125 as described above, the bent portions on respective sides of the inclined portions 115 and 125 are unfolded and the length of the first metal sheet 10 may increase when the bending area BA is bent according to a folding of the display device 1. Accordingly, when the display panel DP, the function layers FL1 and FL2, and/or the cover window CW are transformed, the base film BF may be deformed, so deformation, such as buckling on the display panel DP, the function layers FL1 and FL2, and/or the cover window CW, or generation of damages, such as fracturing, may be controlled.

Referring to FIG. 7, the base film BF includes a metal sheet 10 and a step compensating layer 30. Differing from exemplary embodiments described with reference to FIG. 5 and FIG. 6 including two metal sheets 10 and 20, the base film BF according to the present exemplary embodiment includes one metal sheet 10, and the metal sheet 10 is not divided into two portions but is integrally formed instead.

The metal sheet 10 includes a first flat portion 111, a second flat portion 112, a third flat portion 113, a first inclined portion 115 disposed between the first flat portion 111 and the second flat portion 112, and a second inclined portion 117 disposed between the second flat portion 112 and the third flat portion 113. The first inclined portion 115 is bent from the first flat portion 111 and the second flat portion 112 at an obtuse angle, and the second inclined portion 117 is respectively bent from the second flat portion 112 and the third flat portion 113 at an obtuse angle. Accordingly, the metal sheet 10 includes folded portions (first and second inclined portions 115 and 117 and bent portions on respective sides) like the letter "Z", so the metal sheet 10 may become longer than the metal sheet 10 shown in FIG. 5 and FIG. 6 when the display device 1 is folded. Therefore, a margin for the base film BF to be transformed may increase corresponding to the transformation of the display panel DP, the function layers FL1 and FL2, and/or the cover window CW.

The upper surface of the first flat portion 111 and the upper surface of the third flat portion 113 may be substantially coplanar. The metal sheet 10 is bent so that the second flat portion 112 may be provided above the first and third flat portions 111 and 113. Differing from what is illustrated, the metal sheet 10 may be bent so that the first and third flat portions 111 and 113 may be provided above the second flat portion 112, and in this case, the display panel DP may be attached to the first and third flat portions 111 and 113 of the metal sheet 10 of the base film BF by the adhesive layer AL4.

The step compensating layer 30 is provided on the metal sheet 10. In further detail, the step compensating layer 30 may be provided on the first and third flat portions 111 and 113 of the metal sheet 10. The upper surface of the step compensating layer 30 and the upper surface of the second flat portion 112 of the metal sheet 10 may be substantially coplanar. Therefore, the step compensating layer 30 may flatten the upper surface of the base film BF by compensating the step that may be generated between the first and third flat portions 111 and 113 of the metal sheet 10 and the second flat portion 112. The step compensating layer 30 may be omitted.

Figure 8:
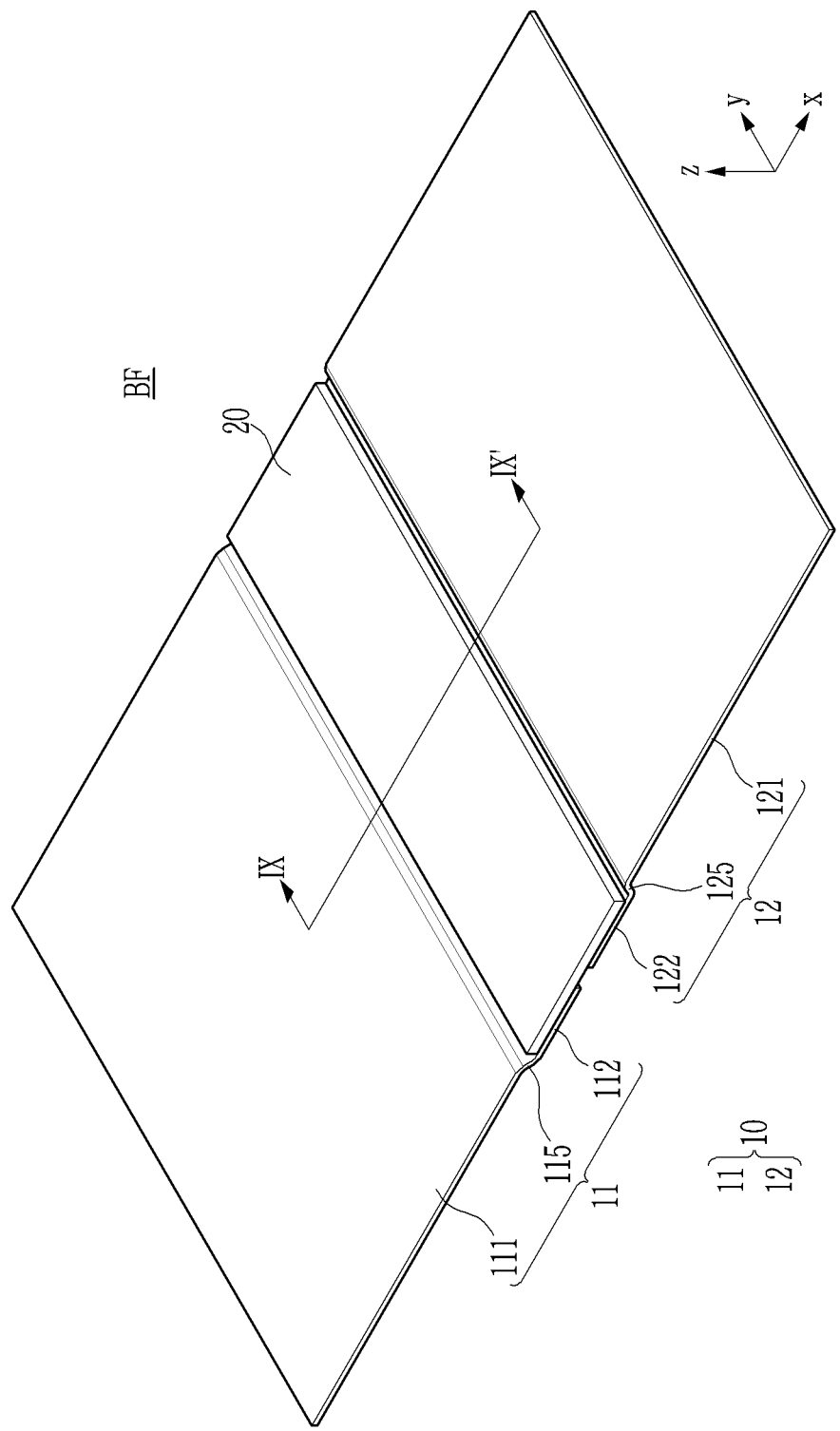
FIG. 8 shows a perspective view a base film in a foldable display device according to an exemplary embodiment.
Figure 9:
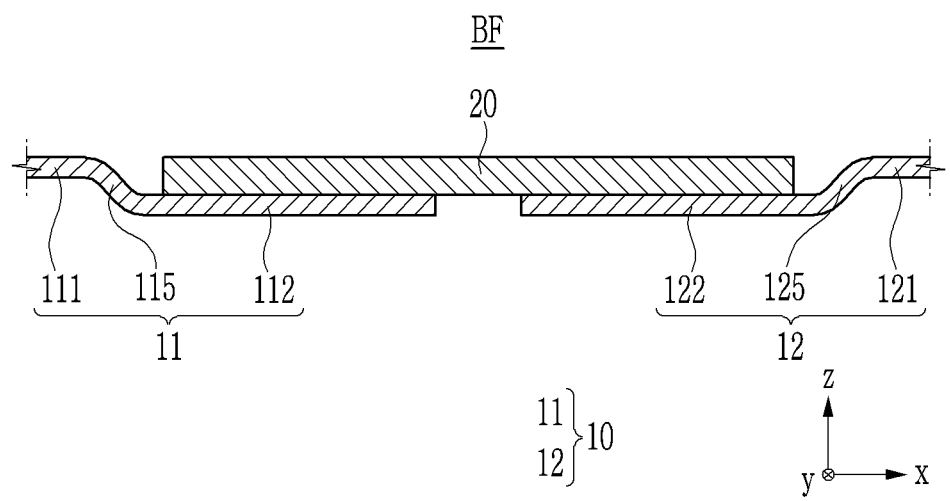
FIG. 9 shows a cross-sectional view taken along a line IX-IX' in FIG. 8.
Figure 10:
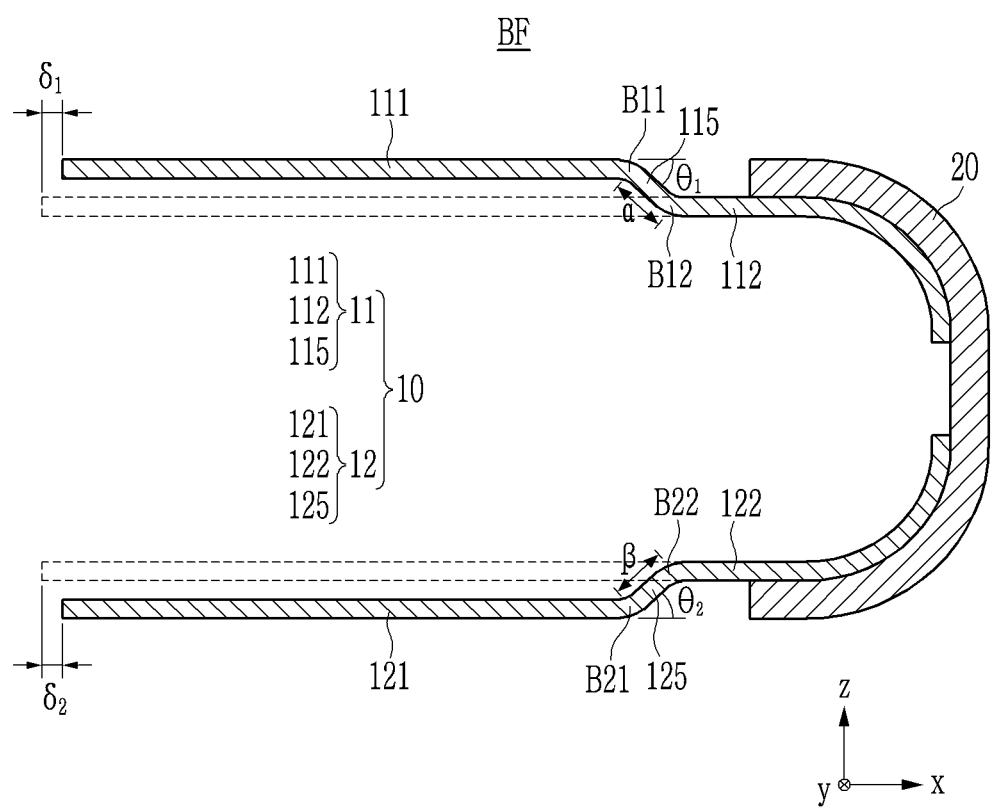
FIG. 10 shows a cross-sectional view of a state of a base film shown in FIG. 8 in a first folding state.
Figure 11:
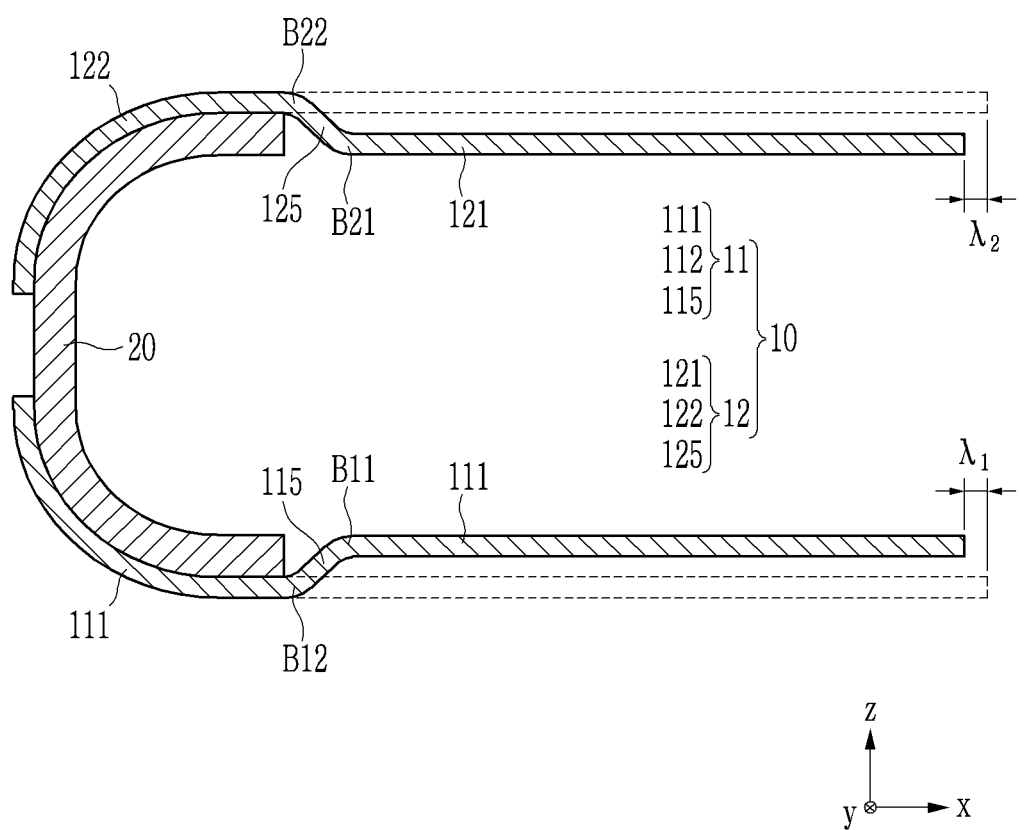
FIG. 11 shows a cross-sectional view of a state of a base film shown in FIG. 8 in a second folding state.

FIG. 8 shows a perspective view of a base film BF in a foldable display device 1 according to an exemplary embodiment, and FIG. 9 shows a cross-sectional view taken along a line IX-IX' in FIG. 8. FIG. 10 shows a cross-sectional view of a state of a base film BF shown in FIG. 8 in a first folding state, and FIG. 11 shows a cross-sectional view of a state of a base film BF shown in FIG. 8 in a second folding state.

The base film BF described with reference to FIG. 8 through FIG. 11 is similar to the base film BF described with reference to FIG. 5, and to clarify the structure of the metal sheet, it will be illustrated without the step compensating layer 30. Therefore, a description of the above structure will be omitted, and a transformation of a metal sheet when it is folded will be mainly described.

Referring to FIG. 8, FIG. 9, and FIG. 10, when the display device 1 is out-folded, the second metal sheet 20 and the second flat portions 112 and 122 of the first metal sheet 10 may be bent at a predetermined curvature radius. The second metal sheet 20 may be bent to be provided further outside than the second flat portions 112 and 122. In this instance, the bent portions B11, B12, B21, and B22 on the respective sides of the inclined portions 115 and 125 of the first metal sheet 10 are unfolded and the length of the first metal sheet 10 may increase. Particularly, referring to FIG. 10, when a length of the inclined portion 115 of the first portion 11 is set to be α and the angle (e.g., acute angle) at which the inclined portion 115 is bent from the first flat portion 111 is set to be $\theta_1$, the increase $\delta_1$ of the length of the first portion 11 when the bent portions B11 and B12 of the first portion 11 of the first metal sheet 10 are completely unfolded as shown with dotted lines is substantially as follows.

$$\delta_1 = \alpha(1-\cos\theta_1)$$

Similarly, when the length of the inclined portion 125 of the second portion 12 is set to be β and the angle (e.g., acute angle) at which the inclined portion 125 is bent from the first flat portion 121 is set to be $\theta_2$, the increase $\delta_2$ of the length of the second portion 12 when the bent portions B21 and B22 of the second portion 12 of the first metal sheet 10 are completely unfolded as shown with dotted line is substantially as follows.

$$\delta_2 = \beta(1-\cos\theta_2)$$

Therefore, the amount of transformation, that is, the increases $\delta_1$ and $\delta_2$ of length, may be determined by controlling the lengths α and β of the inclined portions 115 and 125 and the bending angles $\theta_1$ and $\theta_2$. The increases $\delta_1$ and $\delta_2$ of length of the first metal sheet 10 correspond to the length of the base film BF. Therefore, buckling, separation of layers, or generation of fractures caused by the characteristic difference among the layers of the display device 1 may be reduced or prevented by setting the lengths α and β of the inclined portions 115 and 125 and the bending angles $\theta_1$ and $\theta_2$ so that the length of the first metal sheet 10 may increase corresponding to the transformation of the display panel DP, the function layers FL1 and FL2, and/or the cover window CW.

When the display device 1 is bent, the bent portions B11, B12, B21, and B22 of the first metal sheet 10 may not be completely unfolded but may be partly unfolded, so the increases ($\delta_1+\delta_2$) of length of the first metal sheet 10 may signify an allowable maximum increase of length. In addition, $\alpha$ and $\beta$ may be equivalent to or different from each other, and $\theta_1$ and $\theta_2$ may be equivalent to or different from each other.

The first metal sheet 10 is combined to the display panel DP, the function layers FL1 and FL2, and the cover window CW through the adhesive layers AL1 through AL4, so when the display panel DP, the function layers FL1 and FL2, and/or the cover window CW are transformed, the bent portions B11, B12, B21, and B22 of the first metal sheet 10 may be unfolded like a spring or may be bent and transformed.

Referring to FIG. 8, FIG. 9, and FIG. 11, when the display device 1 is in-folded, the second metal sheet 20 and the second flat portions 112 and 122 of the first metal sheet 10 may be bent. The second metal sheet 20 may be bent to be further inside than the second flat portions 112 and 122. In this instance, the bent portions B11, B12, B21, and B22 at the respective sides of the inclined portions 115 and 125 of the first metal sheet 10 are unfolded and the length of the first metal sheet 10 may increase. Particularly, referring to FIG. 11, when the increase $\lambda_1$ of length of the first portion 11 when the bent portions B11 and B12 of the first portion 11 of the first metal sheet 10 are completely unfolded as shown by dotted lines, and the increase $\lambda_2$ of length of the second portion 12 when the bent portions B21 and B22 of the second portion 12 of the first metal sheet 10 are completely unfolded as shown by dotted lines, are substantially as follows.

$$\lambda_1=\alpha(1-\cos\theta_1),\text{ and}$$

$$\lambda_2=\beta(1-\cos\theta_2)$$

Therefore, the maximum increase ($\lambda_1+\lambda_2$) of length of the first metal sheet 10 in the case of in-folding may be equivalent to the maximum increase ($\delta_1+\delta_2$) of length of the first metal sheet 10 in the case of out-folding.

Figure 12:
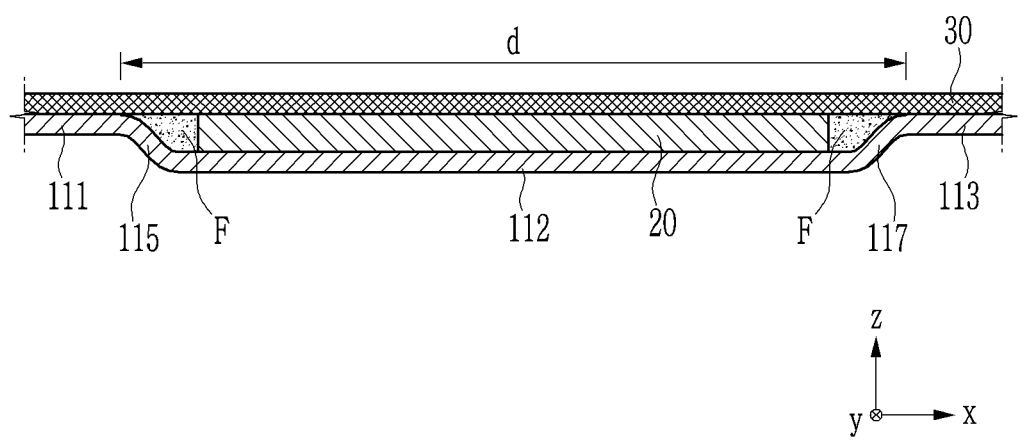
FIG. 12 shows a cross-sectional view according to an embodiment taken along a line IV-IV' in FIG. 1.

FIG. 12 shows a cross-sectional view according to an exemplary embodiment taken along a line IV-IV' in FIG. 1.

Referring to FIG. 12, the base film BF is similar to that shown in FIG. 5, and the first metal sheet 10 is not divided but is integrally formed. In detail, the metal sheet 10 includes a first flat portion 111, a second flat portion 112, and a third flat portion 113, and includes a first inclined portion 115 between the first flat portion 111 and the second flat portion 112 and a second inclined portion 117 between the second flat portion 112 and the third flat portion 113. The first inclined portion 115 is bent from the first flat portion 111 and the second flat portion 112 at an acute angle, and the second inclined portion 117 is bent from the second flat portion 112 and the third flat portion 113 at an acute angle. When the bending area BA is not very narrow, it may be easy to form the inclined portions 115 and 117 according to press processing when the metal sheet 10 is integrally formed. In addition, the first metal sheet 10 shown in FIG. 6 and FIG. 7 may be integrally formed as shown in FIG. 14.

When a curvature radius of the base film BF that is bent when the display device 1 is folded is r millimeters, a distance d between the first flat portion 111 and the third flat portion 113 may be within ($\pi r+10$) millimeters (here, $\pi$ is pi). The purpose of this is for the first and second inclined portions 115 and 117 to be provided in a range (region where deformation of layers or buckling may be easily generated) in which shear deformation of the adhesive layers AL4 and AL5 is substantially generated. When the first and second inclined portions 115 and 117 are provided in such the range, deformation (i.e., unfolding of the bent portions on the respective sides of the first and second inclined portions 115 and 117) of the first metal sheet 10 may be quick and easy. For the same reason, in exemplary embodiments in which the first metal sheet 10 is divided into two portions 11 and 12 (e.g., refer to FIG. 5 and FIG. 6), the distance between the first flat portion 111 of the first portion 11 and the first flat portion 121 of the second portion 12 may be within ($\pi r+10$) millimeters.

In another exemplary embodiment, there may be a gap between the inclined portions 115 and 117 of the first metal sheet 10 and the second metal sheet 20. To prevent the gap from being visible, the gap may be charged with a filler F such as a resin.

Figure 13:
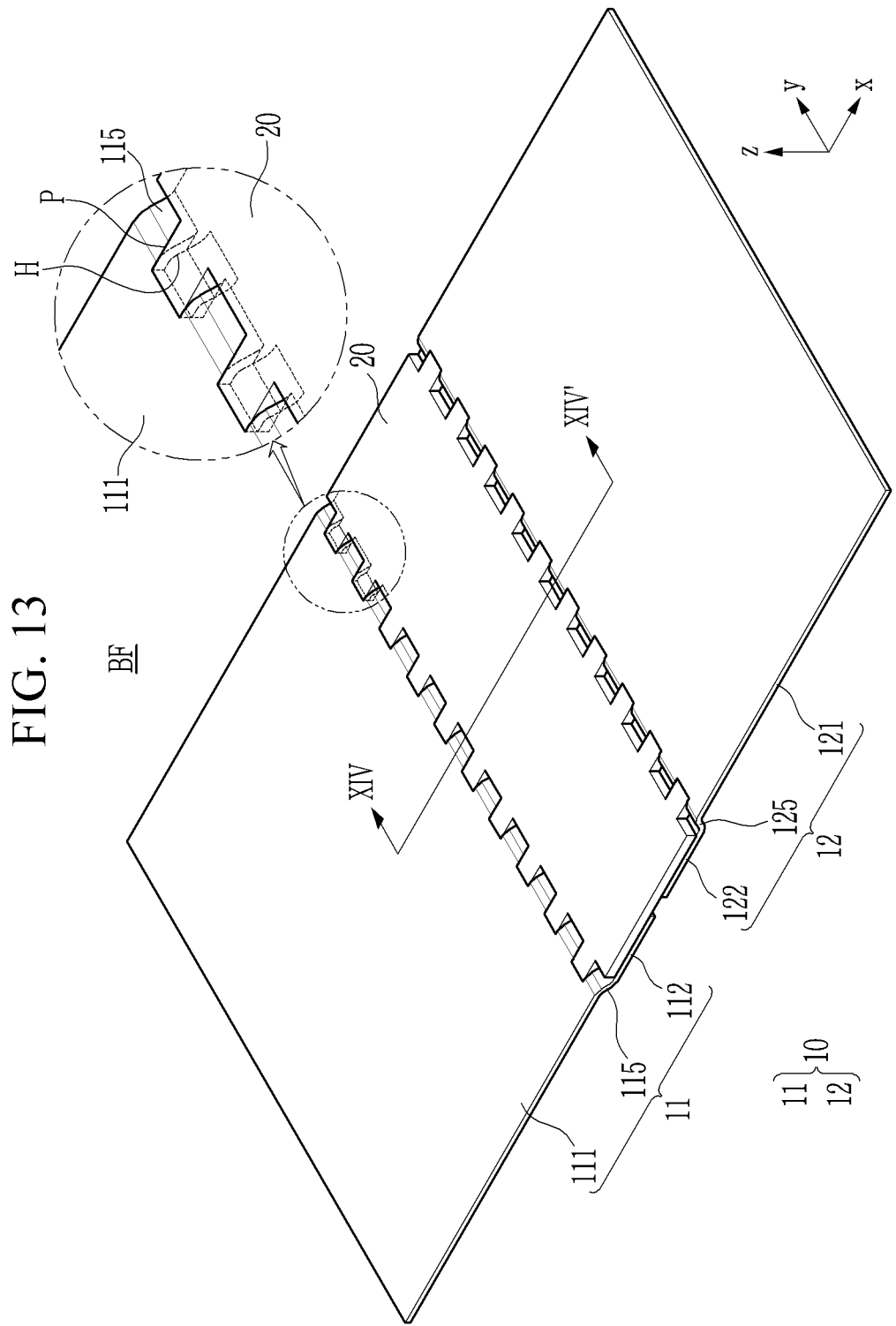
FIG. 13 shows a perspective view a base film in a foldable display device according to an exemplary embodiment.
Figure 14:
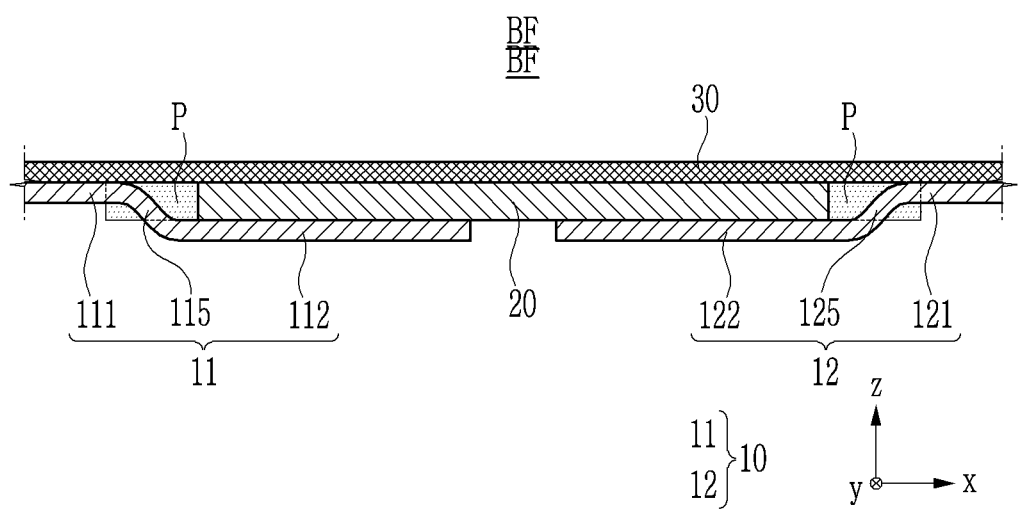
FIG. 14 shows a cross-sectional view taken along a line XIV-XIV' in FIG. 13.

FIG. 13 shows a perspective view a base film BF in a foldable display device 1 according to an exemplary embodiment, and FIG. 14 shows a cross-sectional view taken along a line XIV-XIV' in FIG. 13. To clarify the configuration of the metal sheet, FIG. 13 shows a base film BF excluding a step compensating layer 30.

Referring to FIG. 13 and FIG. 14, although similar to the base film BF according to an exemplary embodiment described with reference to FIG. 8 through FIG. 11, holes H are formed at predetermined intervals in the inclined portions 115 and 125 of the first metal sheet 10 in the second direction y. Further, protrusions P corresponding to the holes H of the inclined portions 115 and 125 are formed on the respective edges in the second direction y on the second metal sheet 20. The protrusions P of the second metal sheet 20 are inserted into the holes H of the inclined portions 115 and 125. Upper surfaces of the protrusions P of the second metal sheet 20 may be substantially in the same level as the upper surfaces of the first flat portions 111 and 121 of the first metal sheet. When the first metal sheet 10 and the second metal sheet 20 of the base film BF are formed and combined as described above, the gap between the inclined portions 115 and 117 and the second metal sheet 20 may be reduced, visibility of the gap may be suppressed, or flatness of the base film BF may be improved.

FIG. 13 and FIG. 14 show a configuration in which the first metal sheet 10 is divided into first and second portions 11 and 12, and the first metal sheet 10 may be integrally formed in a like manner of an embodiment described with reference to FIG. 12. Regarding the base film BF shown in FIG. 13 and FIG. 14, the second metal sheet 20 may be provided between the first metal sheet 10 and the display panel DP in the display device 1. Differing from this, the base film BF may be disposed so that the first metal sheet 10 may be provided between the second metal sheet 20 and the display panel DP in the display device 1. In this case, the step compensating layer 30 may be provided as shown in FIG. 6.

Finally, a configuration of a display panel DP included by a foldable display device 1 according to an exemplary embodiment will now be described with reference to FIG. 15.

Figure 15:
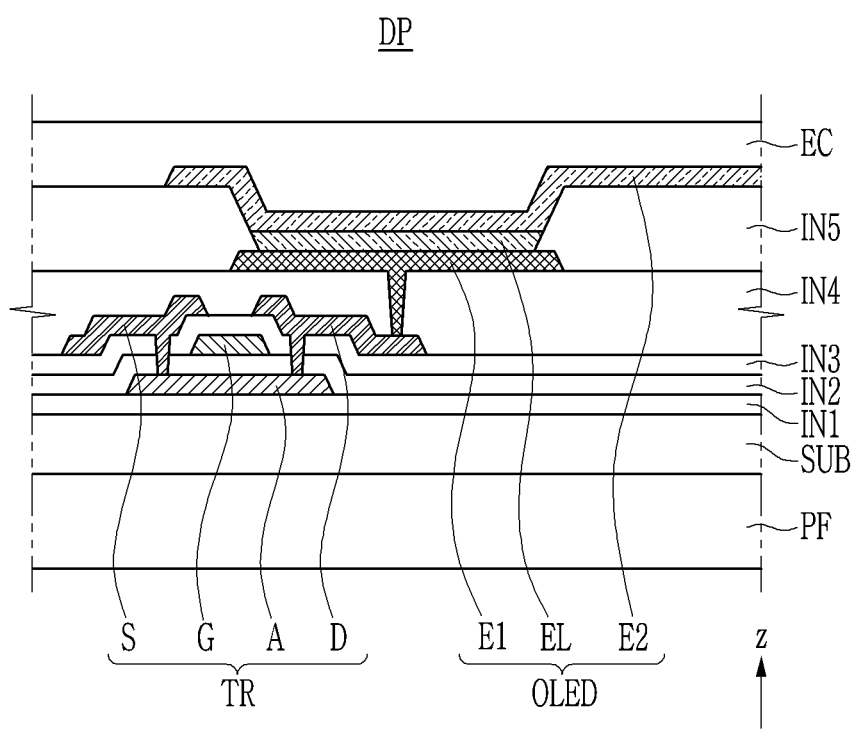
FIG. 15 shows a cross-sectional view of a display panel according to an exemplary embodiment.

FIG. 15 shows a cross-sectional view of a display panel DP according to an exemplary embodiment. FIG. 15 shows a cross-sectional view for an example of a stacked configuration of a display panel DP according to an exemplary embodiment. The cross-section shown in FIG. 15 may correspond to substantially one pixel area.

The display panel DP includes a substrate SUB, a transistor TR formed on the substrate SUB, and an organic light emitting diode OLED connected to the transistor TR.

The substrate SUB may be a flexible substrate made of polymers such as a polyimide (PI), a polyamide (PA), or a polyethylene terephthalate (PET). The substrate SUB may be a barrier layer for preventing moisture or oxygen from permeating from the outside. For example, the substrate SUB may include at least one polymer layer and at least one barrier layer, and the polymer layer and the barrier layer may be alternately stacked.

A first insulating layer IN1 is provided on the substrate SUB. The first insulating layer IN1 may be referred to as a buffer layer, and it may prevent an impurity that may spread to the semiconductor layer A from the substrate SUB and reduce a stress applied to the substrate SUB during a process for forming a semiconductor layer A. The barrier layer and the first insulating layer IN1 may include an inorganic insulating material, such as a silicon oxide or a silicon nitride.

A semiconductor layer A of a transistor TR is provided on the first insulating layer IN1, and a second insulating layer IN2 is provided on the semiconductor layer A. The semiconductor layer A includes a source region, a drain region, and a channel region provided therebetween. The semiconductor layer A may include a semiconductor material such as a polysilicon, an oxide semiconductor, or amorphous silicon. The second insulating layer IN2 may be referred to as a gate insulating layer, and it may include an inorganic insulating material.

A gate conductor including a gate electrode G of a transistor TR is provided on the second insulating layer IN2. The gate conductor may include a metal such as molybdenum (Mo), copper (Cu), aluminum (Al), silver (Ag), chromium (Cr), tantalum (Ta), titanium (Ti), or a metal alloy thereof.

A third insulating layer IN3 is provided on the gate conductor. The third insulating layer IN3 may be referred to as an inter-layer insulating layer, and may include an inorganic insulating material.

A data conductor including a source electrode S and a drain electrode D of the transistor TR is provided on the third insulating layer IN3. The source electrode S and the drain electrode D are connected to the source region and the drain region of the semiconductor layer A through contact holes formed in the third insulating layer IN3 and the second insulating layer IN2. The data conductor may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof.

A fourth insulating layer IN4 is provided on the data conductor. The fourth insulating layer IN4 may be referred to as a planarization layer, and may include an organic insulating material.

A first electrode E1 is provided on the fourth insulating layer IN4. The first electrode E1 may be referred to as a pixel electrode. The first electrode E1 may be connected to the drain electrode D through a contact hole formed in the fourth insulating layer IN4, and may receive a data signal for controlling luminance of the organic light emitting diode OLED.

A fifth insulating layer IN5 is provided on the fourth insulating layer IN4. The fifth insulating layer IN5 may be referred to as a pixel defining layer, and includes an opening overlapping the first electrode E1. A light emission layer EL is provided on the first electrode E1 in the opening of the fifth insulating layer IN5, and a second electrode E2 is provided on the light emission layer EL. The second electrode E2 may be referred to as a common electrode.

The first electrode E1, the light emission layer EL, and the second electrode E2 constitute an organic light emitting diode OLED. The first electrode E1 may be an anode of the organic light emitting diode OLED, and the second electrode E2 may be a cathode of the organic light emitting diode OLED.

An encapsulation layer EC is provided on the second electrode E2. The encapsulation layer EC may encapsulate the organic light emitting diode OLED to prevent moisture or oxygen from permeating from the outside. The encapsulation layer EC may include at least one inorganic material layer and at least one organic material layer, and the inorganic material layer and the organic material layer may be alternately stacked.

A passivation film PF for protecting the display panel DP may be provided below the substrate SUB.

Referring to FIG. 4, the cover window CW, the function layers FL1 and/or the second function layer FL2 may be attached on the encapsulation layer EC of the display panel DP by the adhesive layers AL1, AL2, and AL3. The base film BF and the cushion layer CL may be attached below the passivation film PF of the display panel DP by the adhesive layers AL4 and AL5.

The case in which the display panel DP is an organic light emitting panel has been exemplified, and for example, the display panel DP may be various kinds of display panels such as a display panel including a light emitting diode (LED) or a display panel including a liquid crystal layer.

According to the inventive concept, deformation and damage may be reduced while maintaining the folding characteristic of the foldable display device.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A foldable display device comprising:
   a display panel;
   a cover window disposed on the display panel; and
   a base film attached below the display panel,
   wherein:
   the base film includes a first metal sheet and a second metal sheet bonded to the first metal sheet;
   the first metal sheet includes a first flat portion, a second flat portion, and an inclined portion bent from the first flat portion and the second flat portion; and
   when the foldable display device is folded, bent portions at respective sides of the inclined portion are unbent and the first metal sheet is deformed.

2. The foldable display device of claim 1, wherein the first metal sheet includes a first portion and a second portion that are separated from each other.

3. The foldable display device of claim 2, wherein:
   the first portion includes a first flat portion, a second flat portion, and an inclined portion bent from the first flat portion and the second flat portion; and
   the second portion includes a first flat portion, a second flat portion, and an inclined portion bent from the first flat portion and the second flat portion.

4. The foldable display device of claim 3, wherein:
   the second flat portion of the first portion faces the flat portion of the second portion; and
   the second metal sheet overlaps the second flat portion of the first portion and the second flat portion of the second portion.

5. The foldable display device of claim 4, wherein an upper surface of the first flat portion of the first portion, an upper surface of the first flat portion of the second portion, and an upper surface of the second metal sheet are provided on a same level.

6. The foldable display device of claim 4, wherein a lower surface of the first flat portion of the first portion, a lower surface of the first flat portion of the second portion, and a lower surface of the second metal sheet are provided on a same level.

7. The foldable display device of claim 1, wherein the base film further includes a step compensating layer disposed on the first metal sheet and the second metal sheet.

8. The foldable display device of claim 1, wherein the base film further includes a step compensating layer disposed on the first metal sheet and not on the second metal sheet.

9. The foldable display device of claim 1, wherein a gap between the inclined portion and the second metal sheet is filled with a filler.

10. The foldable display device of claim 1, wherein the first metal sheet further includes a third flat portion, and an inclined portion bent from the second flat portion and the third flat portion.

11. The foldable display device of claim 10, wherein, when a curvature radius of the base film that is bent when the foldable display device is folded is set to be r millimeters, a distance between the first flat portion and third flat portion is within (rrr+10) millimeters.

12. The foldable display device of claim 1, wherein a plurality of holes are defined in the inclined portion, and the second metal sheet includes a plurality of protrusions inserted into the holes.

13. A foldable display device comprising:
a display panel;
a cover window disposed on the display panel; and
a base film attached below the display panel, wherein:
the base film includes a first metal sheet and a second metal sheet overlapping the first metal sheet;
the first metal sheet includes a first portion and a second portion that are separated, while the second metal sheet is bonded to the first portion and the second portion;
each of the first portion and the second portion includes an inclined portion; and
when the foldable display device is folded, bent portions at respective sides of the inclined portion are unbent and a length of the first metal sheet is increased.

14. The foldable display device of claim 13, wherein:
the first portion includes a first flat portion, a second flat portion, and the inclined portion bent from the first flat portion and the second flat portion; and
the second portion includes a first flat portion, a second flat portion, and the inclined portion bent from the first flat portion and the second flat portion.

15. The foldable display device of claim 14, wherein:
a second flat portion of the first portion faces a flat portion of the second portion; and
the second metal sheet is bonded to a second flat portion of the first portion and a second flat portion of the second portion.

16. The foldable display device of claim 14, wherein the inclined portion of the first portion is bent from the first flat portion of the first portion at an acute angle, and the inclined portion of the second portion is bent from the first flat portion of the second portion at an acute angle.

17. The foldable display device of claim 13, wherein:
the base film further includes a step compensating layer disposed on the first metal sheet and the second metal sheet: and
the base film is attached to the display panel by an adhesive layer.

18. The foldable display device of claim 13, wherein:
the base film further includes a step compensating layer disposed on the first metal sheet and not on the second metal sheet; and
the base film is attached to the display panel by an adhesive layer.

* * * * *